(12) United States Patent
Noh et al.

(10) Patent No.: US 7,109,800 B2
(45) Date of Patent: Sep. 19, 2006

(54) BIAS CIRCUIT FOR PROVIDING A CONSTANT BIAS CURRENT TO A POWER AMPLIFIER

(75) Inventors: Youn Sub Noh, Daejeon (KR); Chul Soon Park, Daejeon (KR)

(73) Assignee: Information and Communications University Educational Foundation, Seoul (KR)

( * ) Notice: Subject to any disclaimer, the term of this patent is extended or adjusted under 35 U.S.C. 154(b) by 30 days.

(21) Appl. No.: 10/807,155

(22) Filed: Mar. 24, 2004

(65) Prior Publication Data
US 2004/0189398 A1    Sep. 30, 2004

(30) Foreign Application Priority Data
Mar. 25, 2003    (KR) ............ 10-2003-0018389

(51) Int. Cl.
*H03F 3/04* (2006.01)

(52) U.S. Cl. .................... 330/296; 330/289
(58) Field of Classification Search .......... None
See application file for complete search history.

(56) References Cited

U.S. PATENT DOCUMENTS

| 6,424,225 B1 * | 7/2002 | Choi et al. ............... 330/289 |
| 6,452,454 B1 * | 9/2002 | Shapiro et al. .......... 330/289 |
| 6,515,546 B1 * | 2/2003 | Liwinski ................. 330/296 |

* cited by examiner

*Primary Examiner*—Robert Pascal
*Assistant Examiner*—Krista M. Flanagan
(74) *Attorney, Agent, or Firm*—Bacon & Thomas, PLLC

(57) ABSTRACT

A power amplifier for use in a mobile handset includes an amplifying transistor, a bias circuit including a bias transistor, the bias circuit providing a bias current to bias the amplifying transistor, and a bias current control circuit, responsive to fluctuation in a reference voltage and variation in temperature, for adjusting the bias current to control an operation current of the amplifying transistor.

13 Claims, 2 Drawing Sheets

BIAS CIRCUIT FOR PROVIDING A CONSTANT BIAS CURRENT TO A POWER AMPLIFIER

FIELD OF THE INVENTION

The present invention relates to a power amplifier; and, more particularly, to a power amplifier including a bias current control circuit capable of efficiently providing a constant bias current to the power amplifier regardless of fluctuations in a reference voltage or variations in a temperature.

BACKGROUND OF THE INVENTION

As is well known, modern wireless communication devices, such as mobile handset including a CDMA cell phone, are held to ever-higher performance standards. Transmissions must be clear and undistorted, and the battery in the devices must be small and have a long life. In order to meet these consumer requirements, wireless telephone designers have moved away from using traditional silicon-BASED bipolar transistors as power amplifiers and toward using more exotic transistors, such as heterojunction bipolar transistors (HBTs). Such HBTs provide outstanding power efficiency and high linearity, thus making CDMA cell phone achieve longer battery life and better signal characteristics for voice and data.

Of course, an HBT like a bipolar junction transistor (BJT) requires a direct-current (DC) bias signal to be applied to its input terminal to establish its operating point. The operating point of a transistor may be defined as a point on a transistor's characteristic curve at which the transistor will operate in the absence of an input signal. Since changes in the DC bias signal affect the operating point of the HBT and thus adversely affect the linearity of the amplifier, the DC bias signal must be very stable and unaffected by variations in temperature or in a reference voltage Vref.

FIG. 1 illustrates a conventional power amplifier module 100 for use in a CDMA cell phone. The power amplifier module 100 includes a conventional temperature compensated bias circuit in addition to an amplifying circuit. The amplifying circuit includes an amplifying transistor Q1 having an emitter grounded; an inductor L, one end thereof being supplied with Vcc and the other end thereof being connected to a collector of Q1; an output capacitor Co disposed between the collector of Q1 and an RF_OUT terminal; and an input capacitor Ci coupled between an RF_IN terminal and a base of Q1.

The bias circuit includes a bias transistor Q2, a collector thereof being supplied with Vcc; a diode-connected transistor D1 (i.e., a bipolar transistor with short-circuited collector and base), an anode thereof being connected to a base of Q2; an additional diode-connected transistor D2, an anode thereof being connected to a cathode of D1 and a cathode thereof being grounded; and a resistor R1, one end thereof being supplied with the reference voltage Vref and the other end thereof being connected to the anode of D1.

Referring to FIG. 1, the bias circuit is used to set an operating current for the power amplifier Q1. A reference current Iref flowing from the reference voltage Vref to a circuit ground through the resistor R1 and the diode-connected transistors D1 and D2 is mirrored as a collector current Ic through the power amplifier Q1 between the supply voltage Vcc and ground. The diode-connected transistors D1 and D2 provide a compensating effect that can protect the power amplifiers Q1 and Q2 against thermal runaway due to a temperature increase thereof.

Once the reference voltage Vref is set to have a predetermined value, a bias current $I_B$ of Q1, i.e., a DC component of a base current of Q1 is fixed. That is to say, the bias circuit supplies a constant bias current regardless of the output power, which in turn gives rise to a constant quiescent current $I_C$ (i.e., a DC component of the collector current of Q1), $I_C$ being an operation current of Q1.

However, the conventional power amplifier module 100 described above is highly sensitive to variation in the reference voltage Vref. For example, if the reference voltage Vref increases, a current at the base of the transistor Q2 and subsequently a current at the emitter thereof also increase. As a result, the amount of current $I_B$ flowing into the base of transistor Q1 correspondingly increases. Inversely, if the Vref decreases, a current at the base of the transistor Q2 and subsequently a current at the emitter thereof also decrease and thus the amount of the bias current $I_B$ correspondingly decreases.

Therefore, the conventional power amplifier module 100 has drawback due to the fluctuations in the reference voltage that substantially makes the operation current Ic of the transistor Q1 fluctuate.

On the other hand, as temperature rises, respective turn-on voltages ($V_{BE1}$ and $V_{BE2}$) of transistors Q1 and Q2 are reduced. If the $V_{BE1}$ and $V_{BE2}$ are lowered, voltage $V_A$ at node A is lowered and thus a reference current Iref increases. An increment ΔIref of the reference current Iref is divided into the diode-connected transistors D1 and D2 and the transistors Q1 and Q2 at node A. As a result, a base current of the transistor Q1 increases by a portion of the increment ΔIref to thereby increase the bias current $I_B$.

On the contrary, as temperature is lowered, respective turn-on voltages ($V_{BE1}$ and $V_{BE2}$) of transistors Q1 and Q2 are increased. If the $V_{BE1}$ and $V_{BE2}$ are increased, the voltage $V_A$ at node A is increased and thus the reference current Iref is reduced. A decrement ΔIref of the reference current Iref is divided into the diode-connected transistors D1 and D2 and the transistors Q1 and Q2 at node $V_A$. As a result, the base current of the transistor Q1 decreases by a portion of the decrement ΔIref to thereby reduce the bias current $I_B$.

As described above, the conventional power amplifier module 100 compensates a portion of the increment or the decrement in the bias current $I_B$ due to the variations in temperature, but the compensation result is not so much.

SUMMARY OF THE INVENTION

It is, therefore, an object of the present invention to provide a power amplifier module including a bias current control circuit capable of efficiently providing a constant bias current to the power amplifier regardless of fluctuations in a reference voltage and variations in a temperature.

In accordance with the present invention, there is provided a power amplifier including: an amplifying transistor for generating an output of the mobile handset; a bias circuit including a bias transistor, the bias circuit providing a bias current to bias the amplifying transistor; and a bias current control circuit, responsive to fluctuation of a reference voltage and variation in temperature, for adjusting the bias current to control an operation current of the amplifying transistor.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
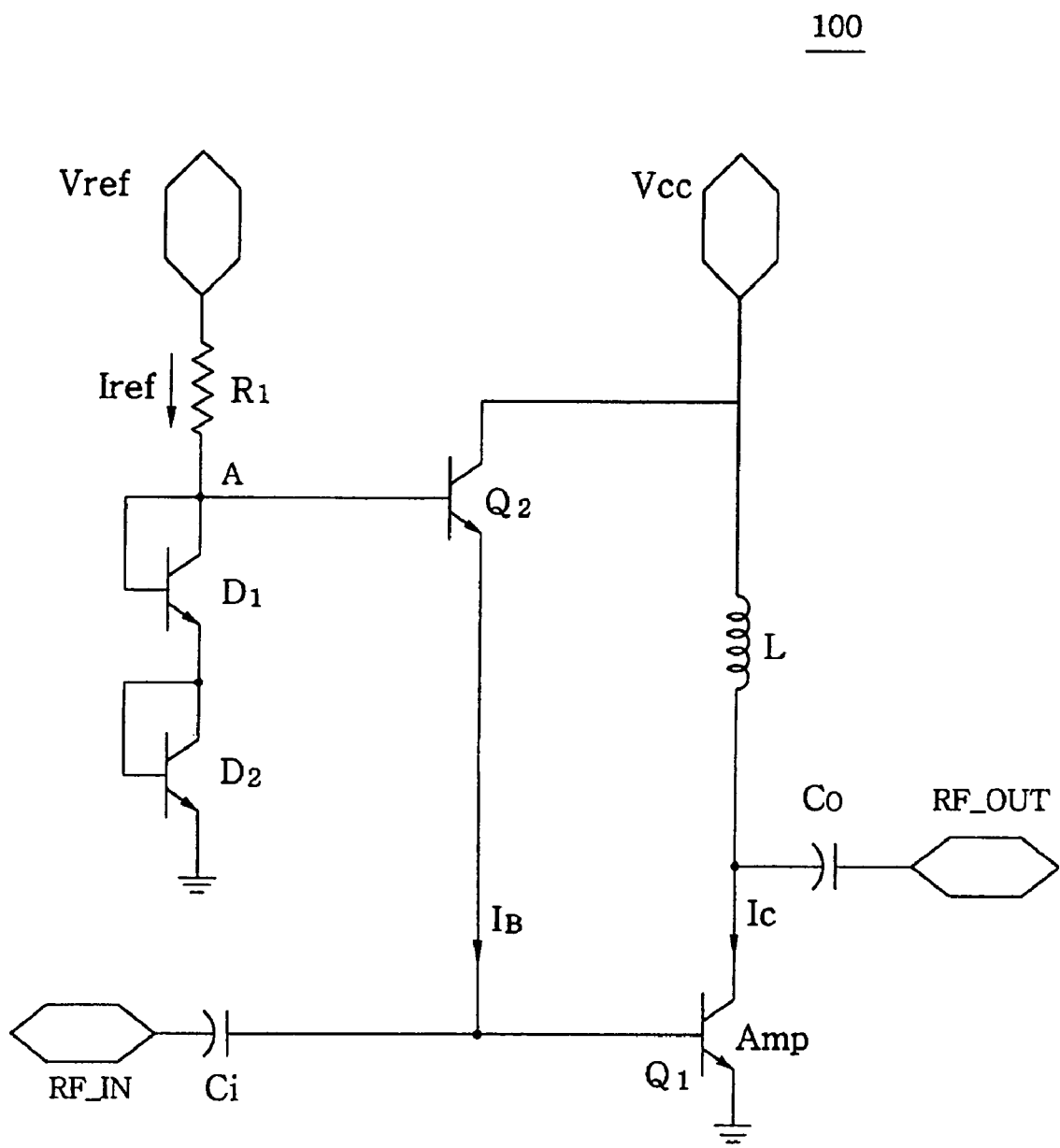
FIG. 1 illustrates a conventional power amplifier module 100 for use in a mobile handset.

A preferred embodiment of the present invention will now be described with reference to FIG. 2. Like parts to those of FIG. 1 are represented by like reference numerals to those thereof and detailed explanation thereof will be omitted.

Figure 2:
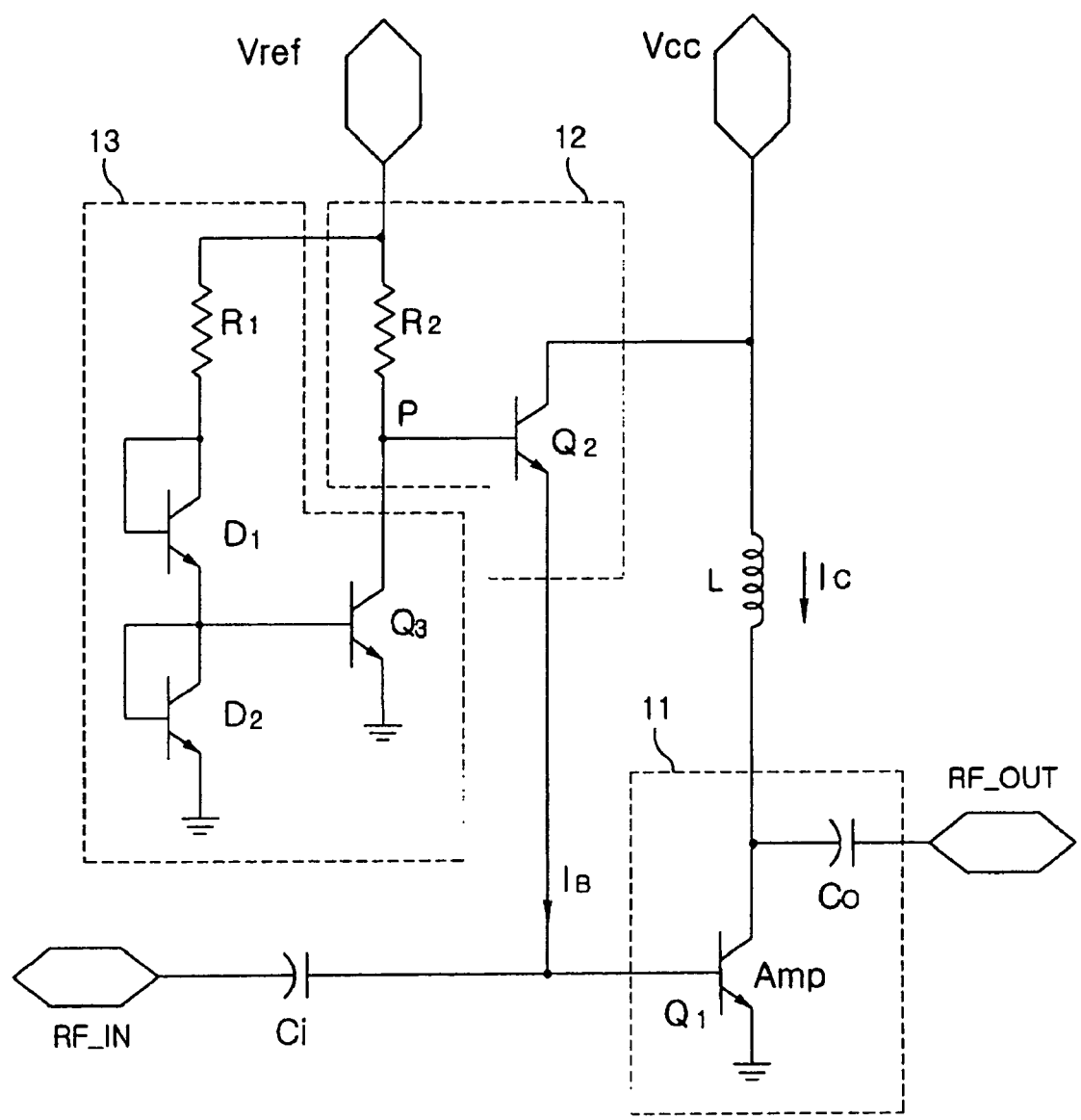
FIG. 2 illustrates a power amplifier module 200 for use in the mobile handset in accordance with the preferred embodiment of the present invention.

FIG. 2 illustrates a power amplifier module 200 for use in a mobile handset, e.g., CDMA cell phone, in accordance with the preferred embodiment of the present invention. The power amplifier module 200 includes a bias circuit 12 and a bias current control circuit 13 in addition to an amplifying circuit 11. The amplifying circuit 11 includes an amplifying transistor Q1 having an emitter grounded; an inductor L, one end thereof being supplied with a supply voltage Vcc and the other end thereof being connected to a collector of the amplifying transistor Q1; an output capacitor Co disposed between the collector of Q1 and an RF_OUT terminal; and an input capacitor Ci coupled between an RF_IN terminal and a base of Q1.

The bias circuit 12 includes a bias transistor Q2, a collector thereof being supplied with the supply voltage Vcc and an emitter thereof being connected to the base of the transistor Q1 and a resistor R2, one end thereof being connected to a base of Q2, i.e., a node P, and the other end thereof being supplied with a reference voltage Vref. The bias circuit 12 is used to set an operating current for the power amplifier Q1 to provide a constant bias current $I_B$.

On the other hand, the bias current control circuit 13 includes a transistor Q3 having an emitter grounded and a collector thereof being connected to the node P; a diode-connected transistor D1 (i.e., a bipolar transistor with short-circuited collector and base); an additional diode-connected transistor D2, an anode thereof being connected to a cathode of D1 and a base of Q3 and a cathode thereof being grounded; and a resistor R1, one end thereof being supplied with a reference voltage Vref and the other end thereof being connected to an anode of D1. The diode-connected transistors D1 and D2 provide a compensating effect that can protect the power amplifiers Q1 to Q3 against thermal runaway due to a temperature increase thereof.

Hereinafter, an operation of the bias current control circuit 13 is explained in view of fluctuations in the reference voltage and variations in temperature.

The bias current control circuit 13 controls a voltage Vp at the node P to provide the constant bias current $I_B$ in the transistor Q2 to the base of the transistor Q1 regardless of the fluctuations in the reference voltage Vref and the variations in temperature.

First, when the reference voltage Vref is fluctuated, the operation of the power amplifier in accordance with the present invention is as follows.

Without the bias current control circuit 13 as shown in FIG. 2, as the reference voltage Vref increases, the voltage Vp at the node P increases and thus the emitter current of the transistor Q2, i.e., the bias current $I_B$, also increases. As a result, a collector current $I_C$, of the transistor Q1 increases. Therefore, the voltage Vp at the node P must be kept nearly constant regardless of the increase of the reference voltage Vref in order to maintain the collector current Ic of the transistor Q1 substantially constant.

On the other hand, with the bias current control circuit 13, as the reference voltage Vref increases, voltage drop across the resistor R2 increases and thus the voltage Vp at the node P decreases to thereby compensate an increment ΔVref of the reference voltage Vref.

If it is assumed that each current gain of the transistors Q2 and Q3 is large enough to ignore each base current thereof, when the reference voltage Vref is fluctuated by ΔVref, a voltage fluctuation at node P can be expressed as follows:

$$\Delta Vp = V'p - Vp \cong \pm \Delta Vref \mp \Delta Vref \frac{R2}{R1}, \qquad \text{Eq. 1}$$

wherein the V'p is a voltage at the node P when the reference voltage fluctuates.

As can be seen in Eq. 1, if R2/R1 is 1, the voltage fluctuation at the node P is zero. Therefore, the voltage Vp can be constantly kept regardless of fluctuations in the reference voltage Vref to thereby maintain the bias current $I_B$ substantially constant. Also, even though each current gain of the two transistors Q2 and Q3 is so small that each base current thereof cannot be ignored, same effect can be obtained by adjusting the R2/R1.

On the other hand, when variation in temperature occurs, the operation of the bias current control circuit 13 in accordance with the present invention can be explained as follows.

Assuming that the reference voltage Vref is an external reference voltage independent of temperature and the bias current control circuit 13 is not considered, then as temperature rises, the voltage Vp at the node P will change since the voltage Vp is equal to the two base-emitter voltage drop 2 Vbe through transistors Q1 and Q2. In other words, as temperature rises, the base-emitter voltage drop Vbe is reduced and thus Vp decreases. As a result, more current flows through resistor R2 and thus the bias current IB also increases. Inversely, as temperature is lowered, the Vbe increases and thus Vp increases. That is, less current flows through resistor R2 and thus the bias current IB also decreases. Therefore, when temperature rises, the voltage Vp at the node P needs to be increased in order to maintain the bias current IB substantially constant and, if otherwise, the voltage Vp has to be decreased.

In case of considering the bias current control circuit 13, as temperature rises, both of a collector current of the transistor Q3 and a voltage drop across the resistor R2 increase and thus the voltage Vp at the node P decreases to thereby maintain the collector current Ic of the transistor Q1 substantially constant.

On the other hand, as temperature is lowered, both of the collector current of the transistor Q3 and the voltage drop across the resistor R2 decrease and thus the voltage Vp at the node P increases to thereby maintain the collector current Ic of the transistor Q1 substantially constant.

If it is assumed that the transistors Q1 to Q3 ideally have same turn-on voltages and each current gain of the transistors Q1 to Q3 is large enough to ignore each base current thereof, when temperature T varies by ΔT, the varied collector current of the transistor Q3 is given by $\Delta I_{c3} = \pm$ $(\Delta V_{BE1}+\Delta V_{BE2})/R1 = \pm 2\Delta V_{BE}/R1$ and thus the voltage fluctuation $\Delta Vp$ can be calculated as follows:

$$\Delta Vp \cong \mp(\Delta V_{BE1} + \Delta V_{BE2})\frac{R2}{R1} \cong \mp 2\Delta V_{BE}\frac{R2}{R1} \qquad \text{Eq. 2}$$

As can be seen in Eq. 2, if R2/R1 is 1, the voltage fluctuations $\Delta Vp$ is $\mp 2\Delta V_{BE}$. Therefore, variation $\pm 2\Delta V_{BE}$ of the voltage Vp occurred in the transistors Q1 and Q2 due to variations in temperature can be effectively compensated to thereby maintain the bias current $I_B$ substantially constant. Also, even though each current gain of the transistors Q1 to Q3 is so small that each base current thereof cannot be ignored, same effect can be obtained by adjusting the R2/R1.

It is to be readily appreciated by those skilled in the art that such variations can be easily accommodated by simple modifications of the preferred embodiment of the present invention, e.g., by employing p-type transistors at the bias current control circuit and so on.

While the invention has been shown and described with respect to the preferred embodiments, it will be understood by those skilled in the art that various changes and modifications may be made without departing from the spirit and the scope of the invention as defined in the following claims.

What is claimed is:

1. A power amplifier, comprising:
   an amplifying transistor;
   a bias circuit including a bias transistor, the bias circuit providing a bias current to bias the amplifying transistor; and
   a bias current control circuit, responsive to fluctuation in a reference voltage and variation in temperature, for adjusting the bias current to control an operation current in the amplifying transistor,
   wherein the bias circuit further includes a first resistor having a first and a second end thereof, the first end being supplied with the reference voltage and the second end being connected to a base of the bias transistor, and wherein the bias current control circuit includes:
   a first diode having a cathode and an anode thereof, the first diode being made of a bipolar junction transistor, whose collector and base are connected to each other;
   a second diode having a cathode and an anode thereof, the second diode being made of a bipolar junction transistor whose collector and base are connected to each other, the cathode of the second diode being grounded, and the anode of the second diode being connected to the cathode of the first diode;
   a second resistor having a first and a second end thereof, the first end of the second resistor being supplied with the reference voltage and the second end of the second resistor being connected to the anode of the first diode; and
   a control transistor, an emitter thereof being grounded and a base thereof being connected to the anode of the second diode and a collector thereof being connected to a node P between the second end of the first resistor and the base of the bias transistor.

2. The power amplifier of claim 1, wherein, if the reference voltage increases, a collector current of the control transistor increases, and, if otherwise, the collector current of the control transistor decreases to thereby maintain a voltage Vp at the node P substantially constant.

3. The power amplifier of claim 1, wherein, if temperature rises, a collector current of the control transistor increases, and, if otherwise, the collector current of the control transistor decreases to thereby compensate fluctuations in a voltage Vp at the node P.

4. The power amplifier of claim 2, wherein a voltage fluctuation $\Delta Vp$ at the node P can be calculated as follows:

$$\Delta Vp = V'p - Vp \cong \pm \Delta Vref \mp \Delta Vref \frac{R2}{R1},$$

wherein the V'p is a voltage at the node P when the reference voltage is fluctuated, the $\Delta Vref$ is a fluctuation in the reference voltage, R1 is the second resistor and R2 is the first resistor.

5. The power amplifier of claim 3, wherein a voltage fluctuation $\Delta VP$ at the node P can be calculated as follows:

$$\Delta Vp \cong \mp(\Delta V_{BE1} + \Delta V_{BE2})\frac{R2}{R1},$$

wherein the $\Delta V_{BE1}$ is a turn-on voltage fluctuation in the amplifying transistor, $\Delta V_{BE2}$ is a turn-on voltage fluctuation in the bias transistor, R1 is the second resistor and R2 is the first resistor.

6. A power amplifier, comprising:
   an amplifying transistor;
   a bias circuit including a bias transistor, an emitter thereof being connected to a base of the amplifying transistor, and the bias transistor providing an emitter current as a bias current to bias the amplifying transistor; and
   a bias current control circuit for maintaining an operation current substantially constant in the amplifying transistor by controlling a base voltage of the bias transistor to provide a constant emitter current to the base of the amplifying transistor regardless of fluctuation in a reference voltage and variation in temperature.

7. The power amplifier of claim 6, wherein if the reference voltage fluctuates, the bias current control circuit maintains the base voltage of the bias transistor substantially constant, and, if the temperature varies, the bias current control circuit compensates fluctuations in the base voltage of the bias transistor.

8. The power amplifier of claim 6, wherein the bias circuit further includes a first resistor having a first and a second end thereof, the first end being supplied with the reference voltage and the second end being connected to a base of the bias transistor.

9. The power amplifier of claim 8, wherein the bias current control circuit includes:
   a first diode having a cathode and an anode thereof, the first diode being made of a bipolar junction transistor, whose collector and base are connected to each other;
   a second diode having a cathode and an anode thereof, the second diode being made of a bipolar junction transistor whose collector and base are connected to each other, the cathode of the second diode being grounded, and the anode of the second diode being connected to the cathode of the first diode;

a second resistor having a first and a second end thereof, the first end of the second resistor being supplied with the reference voltage and the second end of the second resistor being connected to the anode of the first diode; and a control transistor, an emitter thereof being grounded and a base thereof being connected to the anode of the second diode and a collector thereof being connected to a node P between the second end of the first resistor and the base of the bias transistor.

10. The power amplifier of claim 9, wherein, if the reference voltage increases, a collector current of the control transistor increases, and, if otherwise, the collector current of the control transistor decreases to thereby maintain a voltage Vp at the node P substantially constant.

11. The power amplifier of claim 9, wherein, if temperature rises, a collector current of the control transistor increases, and, if otherwise, the collector current of the control transistor decreases to thereby compensate fluctuations in a voltage Vp at the node P.

12. The power amplifier of claim 10, wherein a voltage fluctuation ΔVp at the node P can be calculated as follows:

$$\Delta Vp = V'p - Vp \cong \pm \Delta Vref \mp \Delta Vref \frac{R2}{R1},$$

wherein the V'p is a voltage at the node P when the reference voltage is fluctuated, the ΔVref is a fluctuation in the reference voltage, R1 is the second resistor and R2 is the first resistor.

13. The power amplifier of claim 11, wherein a voltage fluctuation ΔVp at the node P can be calculated as follows:

$$\Delta Vp \cong \mp (\Delta V_{BE1} + \Delta V_{BE2}) \frac{R2}{R1},$$

wherein the $\Delta V_{BE1}$ is a turn-on voltage fluctuation in the amplifying transistor, $\Delta V_{BE2}$ is a turn-on voltage fluctuation in the bias transistor, R1 is the second resistor and R2 is the first resistor.

* * * * *